(12) United States Patent
Poss

(10) Patent No.: US 10,459,479 B2
(45) Date of Patent: Oct. 29, 2019

(54) DATA STORAGE DEVICE CALIBRATING PREAMP CLOCK USING SYSTEM CLOCK

(71) Applicant: Western Digital Technologies, Inc., San Jose, CA (US)

(72) Inventor: Joey M. Poss, Rochester, MN (US)

(73) Assignee: Western Digital Technologies, Inc., San Jose, CA (US)

( * ) Notice: Subject to any disclaimer, the term of this patent is extended or adjusted under 35 U.S.C. 154(b) by 104 days.

(21) Appl. No.: 15/942,481

(22) Filed: Mar. 31, 2018

(65) Prior Publication Data

US 2019/0302831 A1 Oct. 3, 2019

(51) Int. Cl.
| | |
|---|---|
| *G11B 5/00* | (2006.01) |
| *G11B 5/09* | (2006.01) |
| *G06F 1/12* | (2006.01) |
| *H03K 3/03* | (2006.01) |
| *G06F 1/14* | (2006.01) |

(52) U.S. Cl.
CPC .................. *G06F 1/12* (2013.01); *G06F 1/14* (2013.01); *H03K 3/0315* (2013.01)

(58) Field of Classification Search
CPC ....... G11B 5/09; G11B 20/10; G11B 20/0013; G11B 20/10222; G11B 20/1403; G11B 5/00; G11B 5/02; G11B 20/10027

USPC ................... 360/39, 46, 51, 55, 68
See application file for complete search history.

(56) References Cited

U.S. PATENT DOCUMENTS

| | | | |
|---|---|---|---|
| 5,815,043 A | 9/1998 | Chow et al. | |
| 7,741,928 B1 * | 6/2010 | Cousinard | H04B 1/034 331/23 |
| 9,490,778 B1 | 11/2016 | Ho et al. | |
| 2008/0001677 A1 | 1/2008 | Shaked et al. | |

\* cited by examiner

*Primary Examiner* — Nabil Z Hindi

(57) ABSTRACT

A data storage device is disclosed comprising a head actuated over a disk, and preamp circuitry coupled to the head, wherein the preamp circuitry comprises a preamp clock and a clock counter configured to count cycles of the preamp clock. A start command over is transmitted from system circuitry over a serial interface to the preamp circuitry to begin counting a number of cycles of the preamp clock. The system circuitry receives a preamp command over the serial interface from the preamp circuitry, wherein the preamp command is based on the clock counter in the preamp circuitry. The system circuitry generates a frequency adjustment command based on the preamp command, and transmits the frequency adjustment command over the serial interface to the preamp circuitry in order to adjust a frequency of the preamp clock.

16 Claims, 5 Drawing Sheets

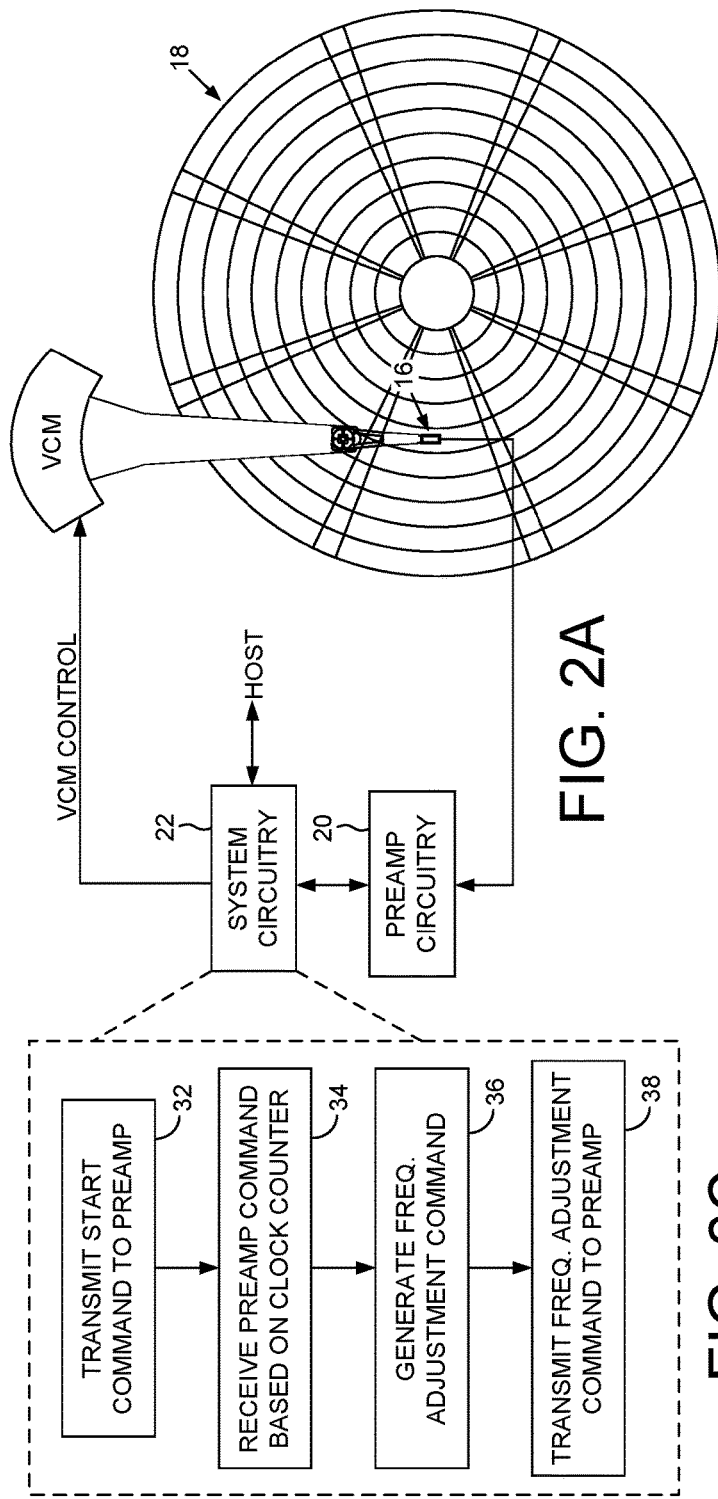
FIG. 2A
FIG. 2C
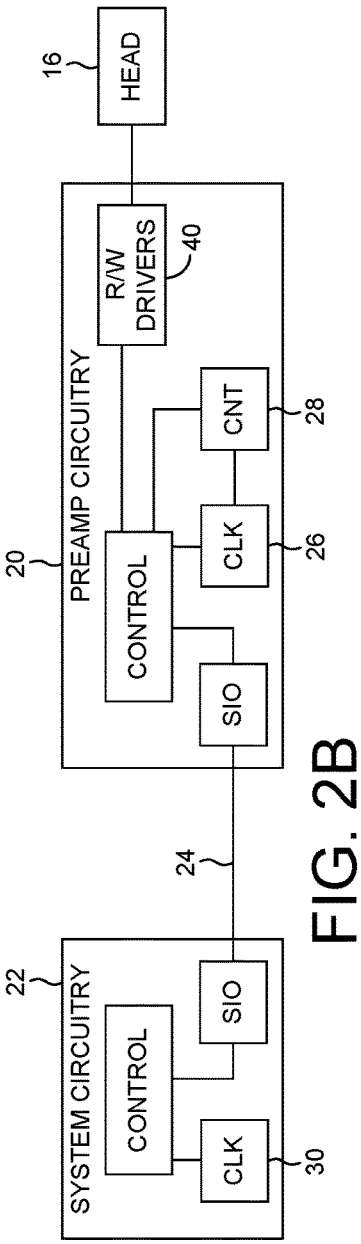
FIG. 2B

DELTA = TARGET CYCLES – PREAMP CLOCK CYCLES

DELTA = TARGET CYCLES − SYSTEM CLOCK CYCLES

DATA STORAGE DEVICE CALIBRATING PREAMP CLOCK USING SYSTEM CLOCK

BACKGROUND

Data storage devices such as disk drives comprise a disk and a head connected to a distal end of an actuator arm which is rotated about a pivot by a voice coil motor (VCM) to position the head radially over the disk. The disk comprises a plurality of radially spaced, concentric tracks for recording user data sectors and servo sectors. The servo sectors comprise head positioning information (e.g., a track address) which is read by the head and processed by a servo control system to control the actuator arm as it seeks from track to track.

FIG. 1 shows a prior art disk format 2 as comprising a number of servo tracks 4 defined by servo sectors $6_0$-$6_N$ recorded around the circumference of each servo track. Each servo sector $6_i$ comprises a preamble 8 for storing a periodic pattern, which allows proper gain adjustment and timing synchronization of the read signal, and a sync mark 10 for storing a special pattern used to symbol synchronize to a servo data field 12. The servo data field 12 stores coarse head positioning information, such as a servo track address, used to position the head over a target data track during a seek operation. Each servo sector $6_i$ further comprises groups of servo bursts 14 (e.g., N and Q servo bursts), which are recorded with a predetermined phase relative to one another and relative to the servo track centerlines. The phase based servo bursts 14 provide fine head position information used for centerline tracking while accessing a data track during write/read operations. A position error signal (PES) is generated by reading the servo bursts 14, wherein the PES represents a measured position of the head relative to a centerline of a target servo track. A servo controller processes the PES to generate a control signal applied to a head actuator (e.g., a voice coil motor) in order to actuate the head radially over the disk in a direction that reduces the PES.

BRIEF DESCRIPTION OF THE DRAWINGS

FIG. 2A shows a data storage device in the form of a disk drive according to an embodiment comprising a head actuated over a disk.

FIG. 2B shows control circuitry according to an embodiment comprising preamp circuitry comprising a preamp clock and a clock counter configured to count cycles of the preamp clock, and system circuitry coupled to the preamp circuit over a serial interface, wherein the system circuitry comprises a system clock.

FIG. 2C is a flow diagram according to an embodiment executed by the system circuitry, wherein the system circuitry generates a frequency adjustment command in response to a preamp command received from the preamp circuitry, wherein the frequency adjustment command is transmitted to the preamp circuitry to adjust the frequency of the preamp clock.

DETAILED DESCRIPTION

Figure 1:
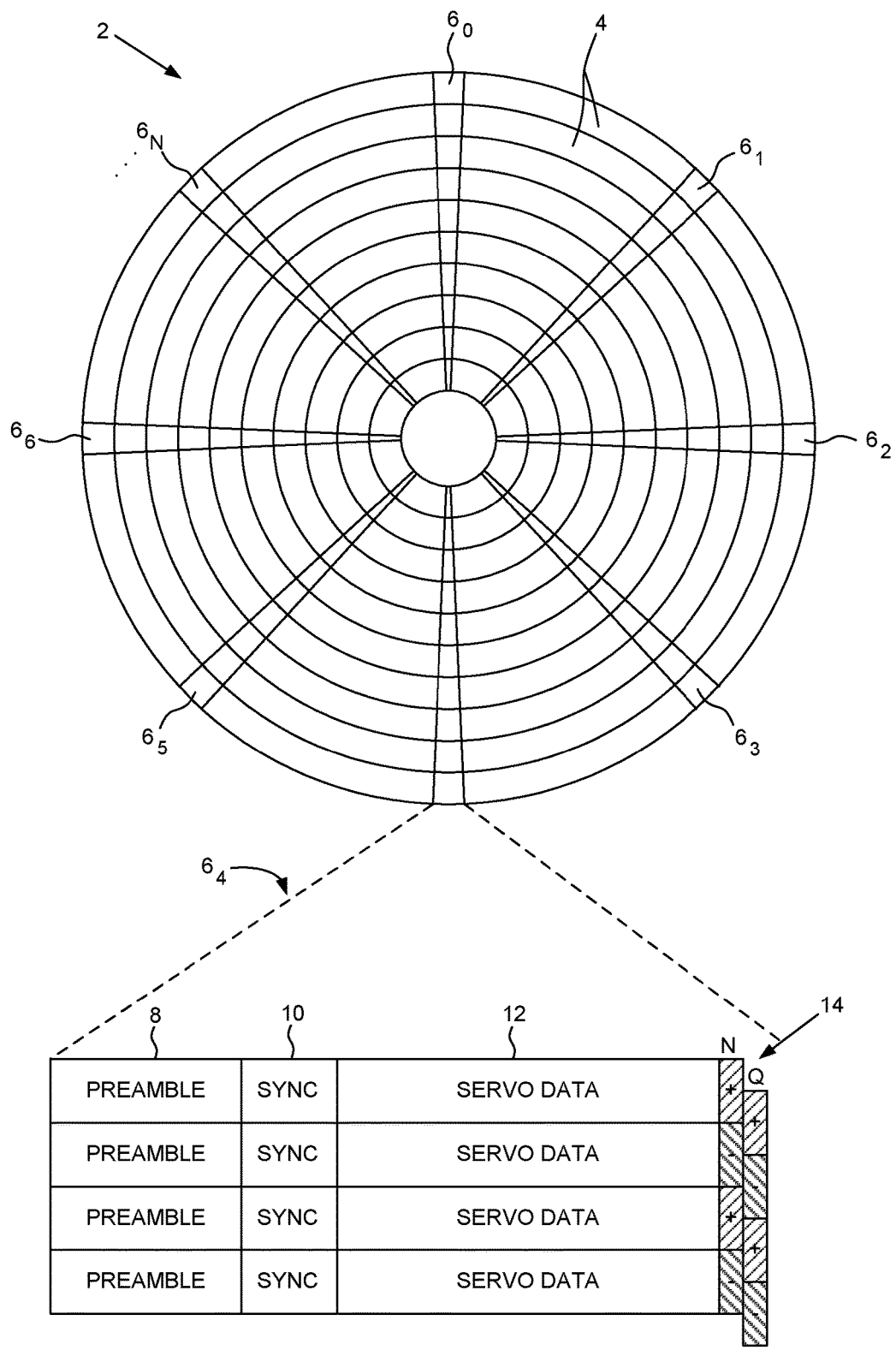
FIG. 1 shows a prior art disk format comprising a plurality of tracks defined by servo sectors.

FIG. 2A shows a data storage device in the form of a disk drive according to an embodiment comprising a head 16 actuated over a disk 18. The disk drive further comprises control circuitry comprising preamp circuitry 20 (FIG. 2B) coupled to the head 16, and system circuitry 22 coupled to the preamp circuitry 20 over a serial interface 24. The preamp circuitry 20 comprises a preamp clock 26 and a clock counter 28 configured to count cycles of the preamp clock 26, and the system circuitry 22 comprises a system clock 30. The system circuitry 22 is configured to execute the flow diagram of FIG. 2C, where a start command is transmitted over the serial interface to the preamp circuitry to begin counting a number of cycles of the preamp clock (block 32). A preamp command is received over the serial interface from the preamp circuitry (block 34), wherein the preamp command is based on the clock counter in the preamp circuitry. A frequency adjustment command is generated based on the preamp command (block 36), and the frequency adjustment command is transmitted over the serial interface to the preamp circuitry in order to adjust a frequency of the preamp clock (block 38).

The preamp circuitry 20 comprises read/write driver circuitry 40 for driving various elements of the head 16, such as a write coil, a read element, a fly height actuator, an energy assisted recording element, such as a laser or microwave element, etc. The preamp clock 26 in the preamp circuitry 20 may be used for any suitable reason, such as to implement an AC erase oscillation, to time a fly height overshoot interval, to time a laser overshoot interval, etc. Further, a sufficient accuracy of the preamp clock 26 may be required to implement the various operating features of the preamp circuitry 20. Accordingly in one embodiment the preamp clock 26 may be calibrated based on a higher frequency and suitably precise system clock 30 used to drive the system circuitry 22. In one embodiment, the system clock 30 may be generated based on a crystal oscillator having sufficient precision over time and temperature fluctuations. In other embodiments, the system clock 30 may be implemented using any suitable semiconductor circuitry, such as a ring oscillator with any suitable odd number of inverter elements connected in a feedback loop. In still other embodiments, the system clock 30 may comprise a combination of a crystal oscillator and other suitable semiconductor circuitry. In one embodiment, the frequency of the preamp clock 26 may be measured relative to the frequency of the system clock 30, and the frequency of the preamp clock 26 adjusted toward a target frequency.

Figure 3A:
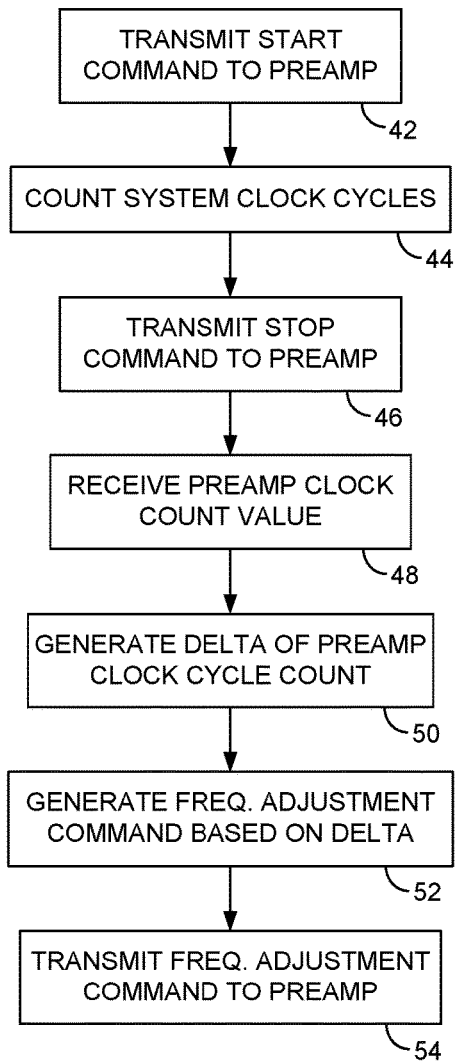
FIG. 3A is a flow diagram according to an embodiment wherein the frequency adjustment command is generated based on a difference between a target count value and the preamp clock count value over an interval timed by the system clock.
Figure 3B:
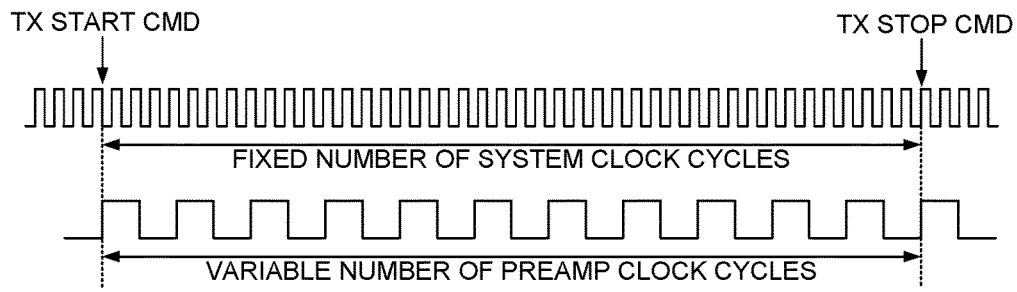
FIG. 3B shows an embodiment wherein a variable number of preamp clock cycles are counted over a fixed number of system clock cycles in order to generate the frequency adjustment command.

FIG. 3A is a flow diagram executed by the system circuitry 22 according to an embodiment which is understood with reference to FIG. 3B, wherein a start command is transmitted over the serial interface 24 to the preamp circuitry 20 to enable the clock counter 28 to begin counting cycles of the preamp clock 26 (block 42). The system circuitry 22 then begins counting the cycles of the system clock 30 (block 44), and when the cycles of the system clock 30 reaches a predetermined fixed value, a stop command is transmitted over the serial interface to the preamp circuitry 20 to stop the counting of the cycles of the preamp clock 26 (block 46). A preamp clock count value is then received over the serial interface from the preamp circuitry (block 48), and a delta value is generated based on a difference between a target number of cycles and the measured number of cycles of the preamp clock (block 50). A frequency adjustment command is generated based on the delta (block 52), and the frequency adjustment command is transmitted over the serial interface to the preamp circuitry in order to adjust the frequency of the preamp clock 26 (block 54). For example, if the measured number of cycles is less than the target number, the frequency adjustment command may increase the frequency of the preamp clock 26 by a suitable increment (e.g., an increment based on the amplitude of the delta).

Referring to the example of FIG. 3B, the frequency of the preamp clock 26 is adjusted until the number of measured cycles of the preamp clock 26 matches a target number of cycles over a predetermined number of cycles of the system clock 30. In one embodiment, the process of measuring the cycles of the preamp clock 26 over a predetermined number of system clock cycles and adjusting the frequency of the preamp clock 26 may be repeated multiple times until the frequency of the preamp clock 26 converges to a target value within a predetermined tolerance.

Figure 4A:
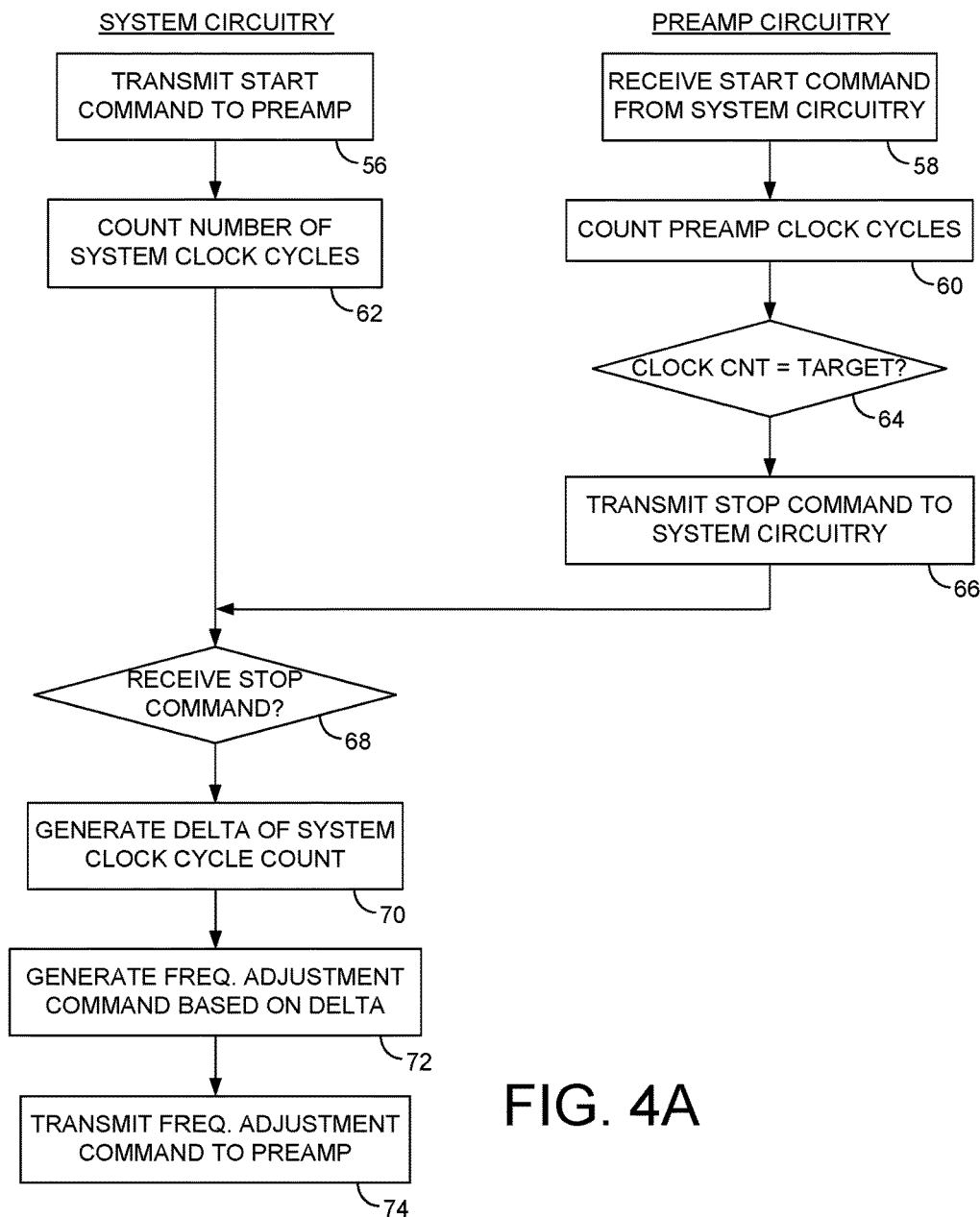
FIG. 4A is a flow diagram according to an embodiment wherein the frequency adjustment command is generated based on a difference between a target count value and a cycle count value of a system clock over an interval timed by the preamp clock.
Figure 4B:
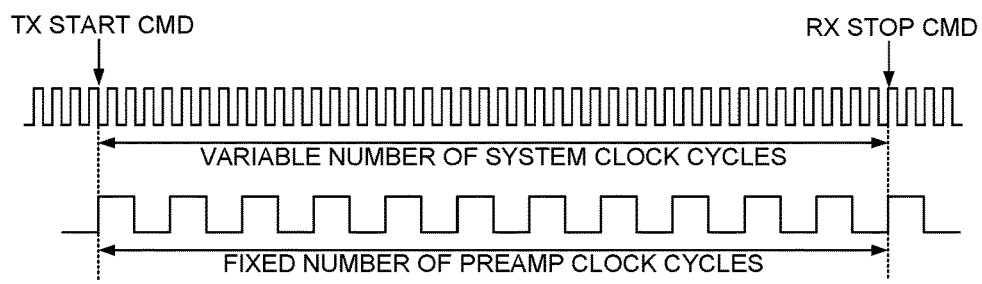
FIG. 4B shows an embodiment wherein a variable number of system clock cycles are counted over fixed number of preamp clock cycles in order to generate the frequency adjustment command.

FIG. 4A is a flow diagram executed by the system circuitry 22 according to an embodiment which is understood with reference to FIG. 4B, wherein a start command is transmitted over the serial interface 24 to the preamp circuitry 20 to enable the counter 28 to begin counting cycles of the preamp clock 26 (block 56). When the preamp circuitry receives the start command (block 58), the clock counter 28 is enabled to count a predetermined number of cycles of the preamp clock 26 (block 60) and concurrently the system circuitry 22 begins counting cycles of the system clock 30 (block 62). When the clock counter 28 reaches a predetermined target value (block 64), the preamp circuitry 20 transmits over the serial interface 24 a stop command to the system circuitry 22, and when the system circuitry 22 receives the stop command (block 68), the system circuitry 22 generates a delta between a target number of cycles and the measured number cycles of the system clock 30 over the predetermined number of cycles of the preamp clock 26 (block 70). A frequency adjustment command is generated based on the delta (block 72), and the frequency adjustment command is transmitted over the serial interface to the preamp circuitry in order to adjust the frequency of the preamp clock 26 (block 74).

Referring to the example of FIG. 4B, the frequency of the preamp clock 26 is adjusted until the number of measured cycles of the system clock 30 matches a target number of cycles over a predetermined number of cycles of the preamp clock 26. In one embodiment, the process of measuring the cycles of the system clock 30 over a predetermined number of preamp clock cycles and adjusting the frequency of the preamp clock 26 may be repeated multiple times until the frequency of the preamp clock 26 converges to a target value within a predetermined tolerance.

Figure 5A:
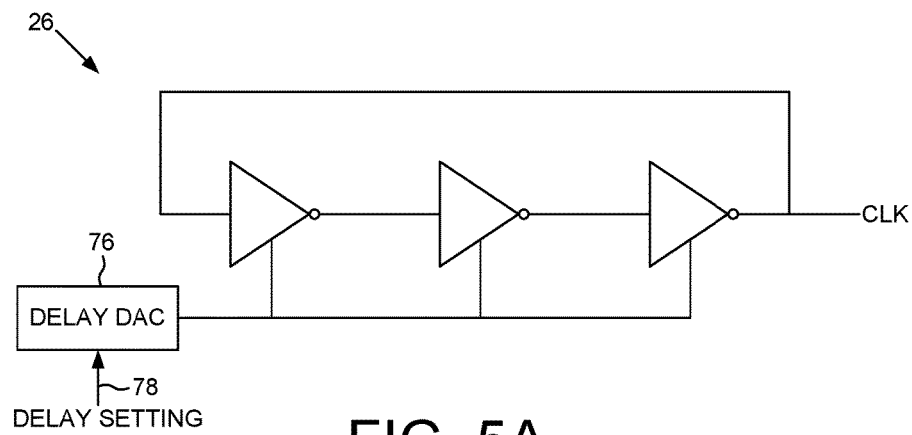
FIG. 5A shows an embodiment of the preamp clock comprising an odd number of inverter elements connected in a feedback loop to form a ring oscillator, wherein a supply voltage to each inverter element is adjusted in order to adjust a frequency of the preamp clock.

Any suitable preamp clock 26 may be employed in the above embodiments, wherein in one embodiment shown in FIG. 5A, the preamp clock 26 comprises an odd number of inverters (e.g., three) connected in a feedback loop to form a ring oscillator. A frequency of the preamp clock 26 is adjusted by adjusting a supply voltage applied to each inverter element (which adjusts the delay of each inverter element). The supply voltage is adjusted by programming a suitable digital-to-analog converter (DAC) 76 with a digital delay setting 78 that represents a desired delay for each inverter element. In one embodiment, the frequency of the preamp clock 26 is measured as described above and the delay setting 78 adjusted over multiple iterations until the frequency of the preamp clock 26 converges to the target value.

Figure 5B:
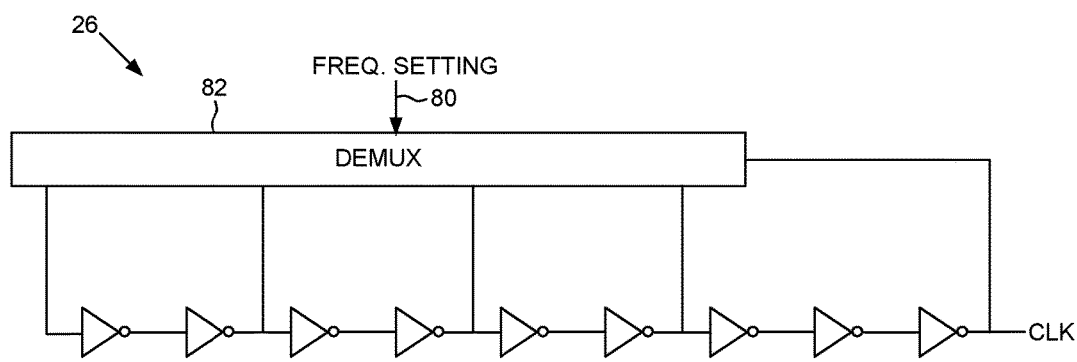
FIG. 5B shows an embodiment of the preamp clock comprising an odd number of inverter elements connected in a feedback loop to form a ring oscillator, wherein a demultiplexer removes/adds a selected number of the inverter elements from the feedback loop in order to adjust a frequency of the preamp clock.

FIG. 5B shows an alternative embodiment for the preamp clock 26 comprising an odd number of inverter elements connected in a feedback loop to form a ring oscillator, wherein a frequency of the preamp clock 26 is adjusted by removing/adding a selected number of the inverter elements within the feedback loop. A digital frequency setting 80 configures a demultiplexer 82 to adjust the number of inverter elements in the feedback loop by connecting the output of the loop to an input of a selected one of the inverters, thereby removing/adding a multiple of two of the inverters within the feedback loop. In one embodiment, the frequency of the preamp clock 26 is measured as described above and the frequency setting 80 adjusted over multiple iterations until the frequency of the preamp clock 26 converges to the target value.

In one embodiment, the frequency of the preamp clock 26 may be calibrated at any suitable time, such as during a manufacturing procedure of the data storage device, at a periodic interval while deployed in the field, each time the data storage device is powered on, when changes in environmental conditions are detected (e.g., a change in ambient temperature), when a degradation in performance is detected, etc. In one embodiment, the calibrated frequency setting for the preamp clock 26 (e.g., the delay setting in FIG. 5A or the frequency setting in FIG. 5B) is stored in a non-volatile memory, such as in a non-volatile semiconductor memory or on a disk 18, and used to configure the frequency of the preamp clock 26 each time the data storage device is powered on.

In one embodiment, the serial interface 24 shown in FIG. 2B may be used to transmit configuration information other than the commands described above for calibrating the preamp clock 26. Accordingly, in one embodiment the serial interface 24 is an existing interface that may be used advantageously to calibrate the preamp clock 26 without requiring additional interconnects between the preamp circuitry 20 and the system circuitry 22, such as transmitting the output of the system clock 30 over a dedicated line to the preamp circuitry 20. Transmitting the system clock 30 over a dedicated line may increase the cost of the data storage device, and it may also create cross-talk interference with the read signal during read operations.

Any suitable interval may be selected to count the clock cycles when calibrating the preamp clock 26 during the calibration procedure in the above described embodiments.

In one embodiment, the interval for counting the clock cycles is selected to be large enough to marginalize the timing variations that may be associated with transmitting the start/stop commands over the serial interface 24, but also sufficiently small to help minimize the calibration time. In one embodiment, the interval for counting the clock cycles may be calibrated toward an optimal value by initializing the frequency of the preamp clock 26 with a suitable calibration value and then counting the number of clock cycles over a maximum length calibration interval. The calibration interval may then be decreased incrementally while measuring the number of clock cycles over each calibration interval. When the number of clock cycles counted during the calibration interval deviates beyond a predetermined tolerance threshold, it means the deviation is due to the timing variations associated with transmitting the start/stop commands over the serial interface. In one embodiment, a margin may be added to the calibration interval that causes the deviation in the clock cycles counted in order to configure the final interval used to calibrate the frequency of the preamp clock 26.

Any suitable control circuitry may be employed to implement the flow diagrams in the above embodiments, such as any suitable integrated circuit or circuits. For example, the control circuitry may be implemented within a read channel integrated circuit, or in a component separate from the read channel, such as a disk controller, or certain operations described above may be performed by a read channel and others by a disk controller. In one embodiment, the read channel and disk controller are implemented as separate integrated circuits, and in an alternative embodiment they are fabricated into a single integrated circuit or system on a chip (SOC). In addition, the preamp circuit described above may be implemented as a separate integrated circuit, integrated into the read channel or disk controller circuit, or integrated into a SOC. In one embodiment, the system clock of the system circuitry may be generated based on a crystal oscillator coupled to an integrated circuit, and in other embodiments the system clock may be generated using suitable integrated and/or analog circuitry without the use of a crystal oscillator.

In one embodiment, the control circuitry comprises a microprocessor executing instructions, the instructions being operable to cause the microprocessor to perform the flow diagrams described herein. The instructions may be stored in any computer-readable medium. In one embodiment, they may be stored on a non-volatile semiconductor memory external to the microprocessor, or integrated with the microprocessor in a SOC. In another embodiment, the instructions are stored on the disk and read into a volatile semiconductor memory when the disk drive is powered on. In yet another embodiment, the control circuitry comprises suitable logic circuitry, such as state machine circuitry.

In various embodiments, a disk drive may include a magnetic disk drive, an optical disk drive, etc. In addition, while the above examples concern a disk drive, the various embodiments are not limited to a disk drive and can be applied to other data storage devices and systems, such as magnetic tape drives, hybrid drives (disk plus solid state), etc. In addition, some embodiments may include electronic devices such as computing devices, data server devices, media content storage devices, etc. that comprise the storage media and/or control circuitry as described above.

The various features and processes described above may be used independently of one another, or may be combined in various ways. All possible combinations and subcombinations are intended to fall within the scope of this disclosure. In addition, certain method, event or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other manner. Tasks or events may be added to or removed from the disclosed example embodiments. The example systems and components described herein may be configured differently than described. For example, elements may be added to, removed from, or rearranged compared to the disclosed example embodiments.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions and changes in the form of the methods and systems described herein may be made without departing from the spirit of the embodiments disclosed herein.

What is claimed is:

1. A data storage device comprising:
   a disk;
   a head a head actuated over the disk;
   preamp circuitry coupled to the head, wherein the preamp circuitry comprises a preamp clock and a clock counter configured to count cycles of the preamp clock; and
   system circuitry coupled to the preamp circuit over a serial interface, wherein the system circuitry comprises a system clock and the system circuitry is configured to:
      transmit a start command over the serial interface to the preamp circuitry to begin counting a number of cycles of the preamp clock;
      receive a preamp command over the serial interface from the preamp circuitry, wherein the preamp command is based on the clock counter in the preamp circuitry;
      generate a frequency adjustment command based on the preamp command; and
      transmit the frequency adjustment command over the serial interface to the preamp circuitry in order to adjust a frequency of the preamp clock.

2. The data storage device as recited in claim 1, wherein the system circuitry is further configured to:
   transmit a stop command over the serial interface to the preamp circuitry to cause the preamp circuitry to generate the preamp command comprising a preamp clock count value based on the clock counter; and
   count a number of cycles of the system clock between the start command and the stop command.

3. The data storage device as recited in claim 2, wherein the system circuitry is further configured to transmit the stop command to the preamp circuit after a predetermined number of cycles of the system clock.

4. The data storage device as recited in claim 3, wherein the system circuitry is further configured to generate the frequency adjustment command based on a difference between a target count value and the preamp clock count value.

5. The data storage device as recited in claim 1, wherein the system circuitry is further configured to count a number of cycles of the system clock between the start command and receiving the preamp command over the serial interface from the preamp circuitry.

6. The data storage device as recited in claim 5, wherein the system circuitry is further configured to generate the frequency adjustment command based on a difference between a target count value and the counted number of cycles of the system clock.

7. Preamp circuitry for use in a data storage device, the preamp circuitry comprising:
    a preamp clock;
    a clock counter configured to count cycles of the preamp clock; and
    control circuitry configured to:
        receive a start command over a serial interface;
        begin counting a number of cycles of the preamp clock;
        transmit over the serial interface a preamp command based on the clock counter in the preamp circuitry;
        receive over the serial interface a frequency adjustment command; and
        adjust a frequency of the preamp clock based on the frequency adjustment command.

8. The preamp circuitry as recited in claim 7, wherein the control circuitry is further configured to transmit the preamp command after the clock counter reaches a predetermined value.

9. The preamp circuitry as recited in claim 8, wherein the preamp command latches a cycle count value of a system clock.

10. The preamp circuitry as recited in claim 9, wherein the frequency adjustment command is based on a difference between a target count value and the cycle count value of the system clock.

11. A method of operating a data storage device, the method comprising:
    transmitting a start command over a serial interface to preamp circuitry to begin counting a number of cycles of a preamp clock within the preamp circuitry;
    receiving a preamp command over the serial interface from the preamp circuitry, wherein the preamp command is based on a clock counter in the preamp circuitry configured to count cycles of the preamp clock;
    generating a frequency adjustment command based on the preamp command;
    transmitting the frequency adjustment command over the serial interface to the preamp circuitry in order to adjust a frequency of the preamp clock; and
    using the preamp clock to write data to a disk using a head.

12. The method as recited in claim 11, further comprising:
    transmitting a stop command over the serial interface to the preamp circuitry to cause the preamp circuitry to generate the preamp command comprising a preamp clock count value based on the clock counter; and
    counting a number of cycles of a system clock between the start command and the stop command.

13. The method as recited in claim 12, further comprising transmitting the stop command to the preamp circuit after a predetermined number of cycles of the system clock.

14. The method as recited in claim 13, further comprising generating the frequency adjustment command based on a difference between a target count value and the preamp clock count value.

15. The method as recited in claim 11, further comprising counting a number of cycles of a system clock between the start command and receiving the preamp command over the serial interface from the preamp circuitry.

16. The method as recited in claim 15, further comprising generating the frequency adjustment command based on a difference between a target count value and the counted number of cycles of the system clock.

* * * * *